United States Patent
Rudeck et al.

(10) Patent No.: US 6,653,683 B2
(45) Date of Patent: Nov. 25, 2003

(54) METHOD AND STRUCTURE FOR AN OXIDE LAYER OVERLYING AN OXIDATION-RESISTANT LAYER

(75) Inventors: Paul J. Rudeck, Boise, ID (US); Kelly T. Hurley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/969,464

(22) Filed: Oct. 1, 2001

(65) Prior Publication Data

US 2002/0014654 A1 Feb. 7, 2002

Related U.S. Application Data

(62) Division of application No. 09/205,140, filed on Dec. 2, 1998, now Pat. No. 6,297,092.

(51) Int. Cl.[7] .............................................. H01L 29/788
(52) U.S. Cl. .................. 257/315; 257/325; 438/758; 438/257
(58) Field of Search ................. 438/257, 758, 438/264, 263; 257/315, 314, 321, 324, 325

(56) References Cited

U.S. PATENT DOCUMENTS

| | | | | |
|---|---|---|---|---|
| 4,870,470 A | * | 9/1989 | Bass, Jr. et al. | 357/23.5 |
| 5,378,659 A | | 1/1995 | Roman et al. | 437/229 |
| 5,656,837 A | | 8/1997 | Lancaster et al. | 257/314 |
| 5,719,410 A | * | 2/1998 | Suehiro et al. | 257/77 |
| 5,781,031 A | | 7/1998 | Bertin et al. | 326/39 |
| 5,789,295 A | * | 8/1998 | Liu | 438/264 |
| 5,963,806 A | * | 10/1999 | Sung et al. | 438/266 |
| 5,981,403 A | * | 11/1999 | Ma et al. | 438/758 |
| 5,985,771 A | | 11/1999 | Moore et al. | 438/791 |
| 6,051,511 A | | 4/2000 | Thakur et al. | 438/791 |
| 6,069,640 A | | 5/2000 | Kubatzki | 438/652 |
| 6,177,311 B1 | | 1/2001 | Kauffman et al. | 438/257 |

OTHER PUBLICATIONS

Cohen, et al. "A novel double metal structure for voltage programmable links" IEEE Electron Device Letters (Skept. 1992) vol. 13, No. 9, pp. 488–490.*

Cohen, et al. "A novel double metal structure for voltage programmable links" IEEE Electron Device Letters (Skept. 1992) vol. 13, No. 9, pp. 488–490(Abstract).*

* cited by examiner

*Primary Examiner*—Caridad Everhart
(74) *Attorney, Agent, or Firm*—Kevin D. Martin

(57) ABSTRACT

A method used during the formation of a semiconductor device such as a flash memory device includes the steps of forming a floating gate layer over a semiconductor wafer substrate then forming a first oxide layer over the floating gate layer. An oxidation-resistant layer such as a nitride layer is formed over the first oxide layer wherein a first portion of the oxidation-resistant layer oxidizes more readily than a second portion of the oxidation-resistant layer. To accomplish this the first portion of the oxidation-resistant layer can be formed to have a higher silicon concentration than the second portion. The first portion of the oxidation-resistant layer is oxidized to form a second oxide layer and a control gate layer is formed over the second oxide layer. An in-process semiconductor device is also described.

3 Claims, 2 Drawing Sheets

METHOD AND STRUCTURE FOR AN OXIDE LAYER OVERLYING AN OXIDATION-RESISTANT LAYER

This application is a division of Ser. No. 09/205,140 filed Dec. 02, 1998 now U.S. Pat. No. 6,297,092.

FIELD OF THE INVENTION

The invention relates generally to the field of nonvolatile semiconductor memories, and more specifically to the field of floating gate programmable memories.

BACKGROUND OF THE INVENTION

Floating gate memory devices such as flash memories include an array of electrically programmable and electrically erasable memory cells. Typically, each memory cell comprises a single n-channel metal oxide semiconductor (NMOS) transistor, including a floating gate interposed between a control (input) gate and a channel. A layer of high-quality tunnel oxide used as gate oxide separates the transistor channel and the floating gate, and an oxide-nitride-oxide (ONO) dielectric stack separates the floating gate from the control gate. The ONO stack typically comprises a layer of silicon nitride ($Si_3N_4$) interposed between an underlying layer and an overlying layer of silicon dioxide ($SiO_2$). The underlying layer of $SiO_2$ is typically grown on the first doped polycrystalline silicon (poly) layer. The nitride layer is deposited over the underlying oxide layer, and the overlying oxide layer can be either grown or deposited on the nitride layer. The ONO layer maximizes the capacitive coupling between the floating gate and the control gate and minimizes the leakage of current through the film.

In order to program a flash cell the drain region and the control gate are raised to predetermined potentials above a potential applied to the source region. For example 12 volts are applied to the control gate, 0.0 volts are applied to the source, and 6.0 volts are applied to the drain. These voltages produce "hot electrons" which are accelerated from the substrate across the gate oxide layer to the floating gate. To erase a flash cell a high positive potential, for example 12 volts, is applied to the source region, the control gate is grounded, and the drain is allowed to float. These voltages are applied for a timed period, and the longer the period the more the cell becomes erased. A strong electric field develops between the floating gate and the source region, and negative charge is extracted from the floating gate across the tunnel oxide to the source region, for example by Fowler-Nordheim tunneling.

The bottom and top silicon dioxide layers in the ONO stack with current technology are typically about 40 Å thick and the silicon nitride layer is typically about 100 Å thick. This silicon dioxide layer passivates any pinhole defects in the nitride, which are common with nitride layers. Oxidizing the nitride layer to form the overlying silicon dioxide layer has improved pinhole passivation over deposited oxide layers. Further, the thickness of the top silicon dioxide layer is easier to control when grown rather than deposited. However, because the Si—N bond is very stable and silicon nitride has a low availability of unreacted silicon, it is difficult and time consuming to oxidize nitride at lower temperatures. Thus the nitride oxidation process is typically performed at relatively high temperatures for example at 950° C. or higher. If the oxidation temperature is lowered to 900° C. or below, it will require at least 120 minutes to form a 40 Å film.

Increased processing temperatures, such as those for growing silicon dioxide on nitride, are known to cause various problems in the field of semiconductor device manufacturing, and failures related to flash memory devices in particular. For example, increased temperatures are known to stress the interfaces of previously grown films such as the tunnel oxide and field oxide. These films then become more prone to charge trapping, which degrades the operation of the device.

A method for forming a semiconductor device, particularly a flash memory device, which allows for the improved formation of a silicon dioxide layer over a layer which resists oxide formation, such as a nitride layer in an ONO stack, would be desirable.

SUMMARY OF THE INVENTION

The present invention provides a new method for forming an interlayer dielectric, for example an oxide-nitride-oxide (ONO) layer between a floating gate layer and a control gate layer, which allows for the growth of an oxide layer over a nitride layer at decreased temperatures compared with conventional processes. In accordance with one embodiment of the invention a first oxide layer is grown or deposited over a floating gate poly layer, then a nitride layer is formed over the first oxide layer. During the nitride formation, at least an upper portion of the nitride layer is siliconized. Finally, a second oxide layer is grown over the nitride layer. The siliconized (silicon-rich) nitride layer enhances the formation of the second oxide layer and allows for its growth at lower temperatures than conventional processes. Growing the second oxide layer rather than depositing the second oxide layer provides improved healing of pinhole defects in the nitride layer. Growing the second oxide layer at lower temperatures than can be done with conventional processing reduces problems associated with a tunnel oxide layer of a flash memory device and reduces other temperature-induced failures.

In a second embodiment a pure silicon layer, such as a thin polycrystalline silicon layer is formed over a nitride layer in the ONO stack. The polycrystalline silicon layer is more easily oxidized than the nitride layer, thereby decreasing processing time.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
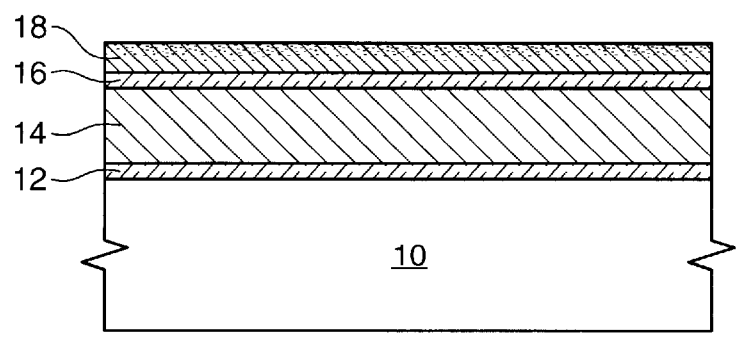
FIGS. 1–3 are cross sections of a first embodiment of the invention using a concentration of oxidation-enhancing material such as silicon within a oxidation-resistant layer such as nitride.

FIG. 1 depicts a memory structure comprising a semiconductor wafer substrate assembly comprising a semiconductor wafer 10, a gate oxide layer such as a tunnel oxide layer 12, and a first polycrystalline silicon (poly) layer which forms, for example, a flash transistor floating gate 14. FIG. 1 further comprises an oxide layer 16 and a silicon nitride layer 18 which form a portion of an oxide-nitride-oxide (ONO) layer.

The instant embodiment of the invention relates to the formation of the ONO layer. The gate oxide 12, floating gate poly layer 14 and first oxide layer 16 of an ONO stack are formed according to means known in the art. Poly layer 14, for example, is partially oxidized to form a first layer of silicon dioxide dielectric of from about 30 Å thick to about 45 Å thick over the floating gate poly layer 14.

Next, a blanket silicon nitride layer 18 is deposited on the first silicon dioxide layer 16. Silicon nitride layers are known in the art to resist oxidation, and thus high-temperature processing is conventionally required to oxidize the layer. To provide a nitride layer which is more readily oxidized at lower temperatures, at least an upper portion of the nitride is siliconized such that it comprises a concentration of silicon atoms greater than a lower portion of the nitride. Thus a conventional first lower portion of the nitride layer can be formed in combination with a second upper portion which is silicon-rich. The lower portion resists oxidation so that the nitride layer is not over-oxidized and is self-limiting. This allows the desirable electrical properties of nitride to be maintained, while the upper portion is more readily oxidized due to the concentration of silicon atoms.

To form the silicon nitride layer having a low concentration of silicon in a lower portion and a higher concentration of silicon in an upper portion, the wafer substrate assembly having oxide layer 16 is placed in (or remains from the prior process in) a low pressure chemical vapor deposition (LPCVD) furnace at a temperature of between about 400° C. and about 800° C., for example about 720° C. Silane gas ($SiH_4$) or dichlorosilane gas (DCS, $SiCl_2H_2$) and ammonia gas ($NH_3$) are introduced into the chamber. A DCS flow rate is between about 20 sccm and about 100 sccm, for example about 30 sccm, and the ammonia flow rate is between about 150 sccm and 300 sccm, for example about 180 sccm. If silane is used, the values listed herein for DCS can be modified by one of ordinary skill in the art for silane. After about 20 minutes the flow of the ammonia is reduced and/or the flow rate of the DCS is increased which results in the availability of more silicon atoms for incorporation into the nitride. The flow rate to which the ammonia gas is reduced or the rate at which the DCS is increased is a function of initial flow and the required oxidation properties of the siliconized nitride film. Generally, a reduced ammonia flow rate of between about 10 sccm and about 30 sccm and/or an increased DCS flow rate of between about 30 sccm and about 110 sccm would be sufficient. The chemical formula for the siliconized nitride layer will be $Si_xN_4$, where x>3. The change of the ammonia and/or DCS flow rates can be performed over an extended period of time to provide a gradated silicon concentration. A more rapid change, for example with an instant change over one second or less would provide a more abrupt silicon concentration change. For this process, a nitride layer 100 Å would be formed. The structure having a siliconized nitride layer 18 is depicted in FIG. 1.

It should be noted that the lower portion of the silicon nitride layer is predominantly $Si_3N_4$ although other molecules may exist. Further, while the formula of the siliconized nitride is predominantly $Si_xN_4$ where x>3 and is denoted as such herein, some $Si_3N_4$ or other molecules may be incorporated into the film.

Figure 2:
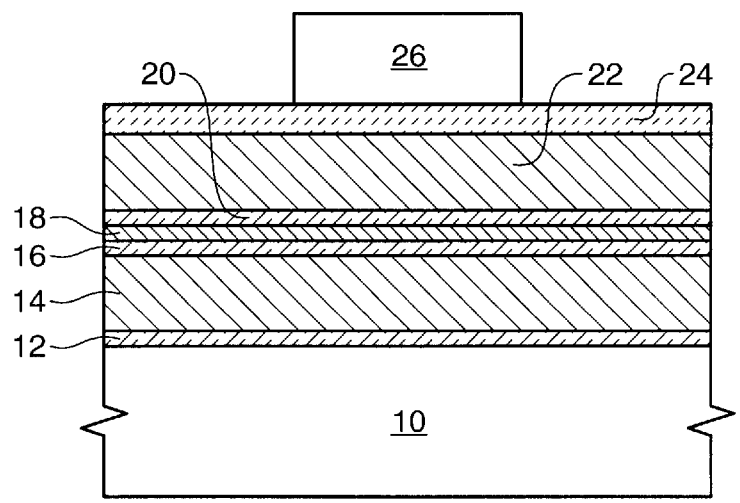
Figure 3:
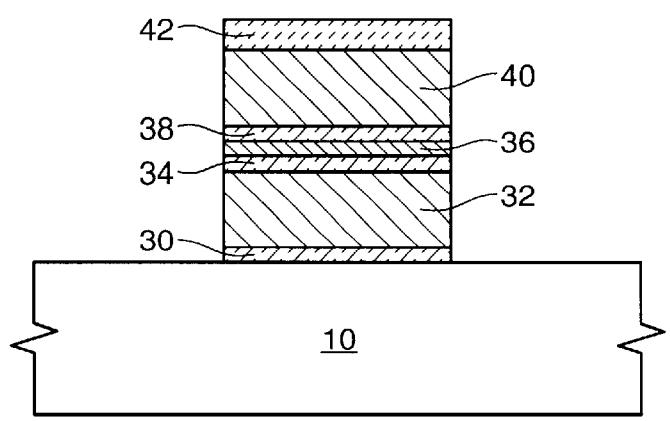

Next, the siliconized nitride is oxidized to form the upper oxide layer 20 in the ONO stack from about 10 Å to about 40 Å thick as depicted in FIG. 2. The wafer assembly substrate is placed into an oxidation furnace (atmospheric furnace). The nitride is subjected to a temperature of between about 750° C. and about 900° C. (for example 900° C.) for between about five minutes and about 90 minutes (for example 30 minutes) in a dry oxidizing atmosphere of oxygen or a wet oxidizing atmosphere of oxygen and hydrogen. For a wet oxidation, $H_2$ and $O_2$ flow rates of between about 1.0 standard liters/min (SLM) to about 10 SLM would be sufficient. The temperatures of this step are much less than the temperatures normally required to oxidize a nitride layer, which are typically in the range of from 950° C. to 1050° C. Wafer processing then continues according to means known in the art, for example to form the control gate poly layer 22 over the ONO stack, additional oxide layers 24 over the control gate poly 22 then masking 26 and etching the two layers of poly and the ONO stack to pattern the structure. FIG. 3 depicts the patterned gate oxide 30, floating gate 32, lower oxide 34 of the ONO layer, nitride 36 of the ONO layer, upper oxide 38 of the ONO layer, control gate 40, and an oxide layer 42 overlying the control gate 40.

Figure 4:
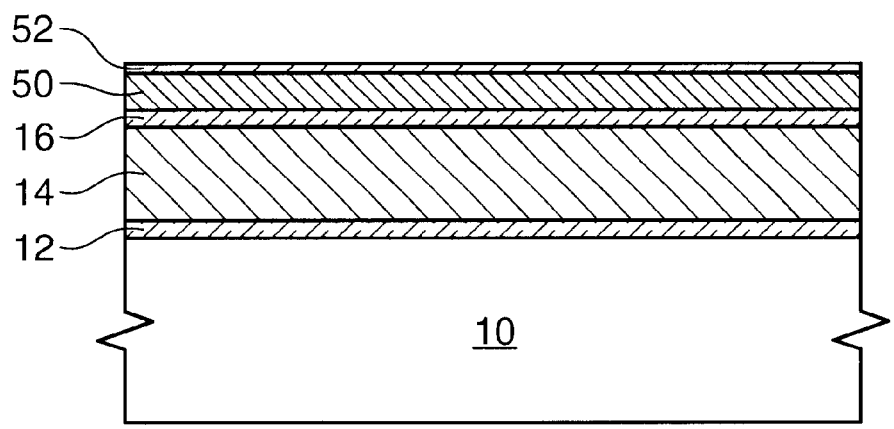
FIGS. 4–5 are cross sections of a second embodiment of the invention using a thin layer which is readily oxidized, such as polycrystalline silicon, over a nitride layer to form an oxide-nitride-oxide layer between a floating gate and a control gate.

Another embodiment of the invention includes forming the tunnel oxide 12 over a semiconductor wafer 10, forming the floating gate poly layer 14, and forming the first oxide layer 16 and a nitride layer 50 of the ONO stack as depicted in FIG. 4. These layers can be conventionally formed. Subsequently, a thin blanket layer of poly or amorphous silicon 52 is formed on the nitride layer. A poly or amorphous silicon layer can be deposited over the nitride in an LPCVD furnace at a temperature of between about 500° C. and about 700° C., for example 620° C., typically using silane gas as a source. The process continues for between about 30 seconds to about 150 seconds to form a poly layer between about 5 Å thick to about 25 Å thick, for example about 20 Å thick.

Figure 5:
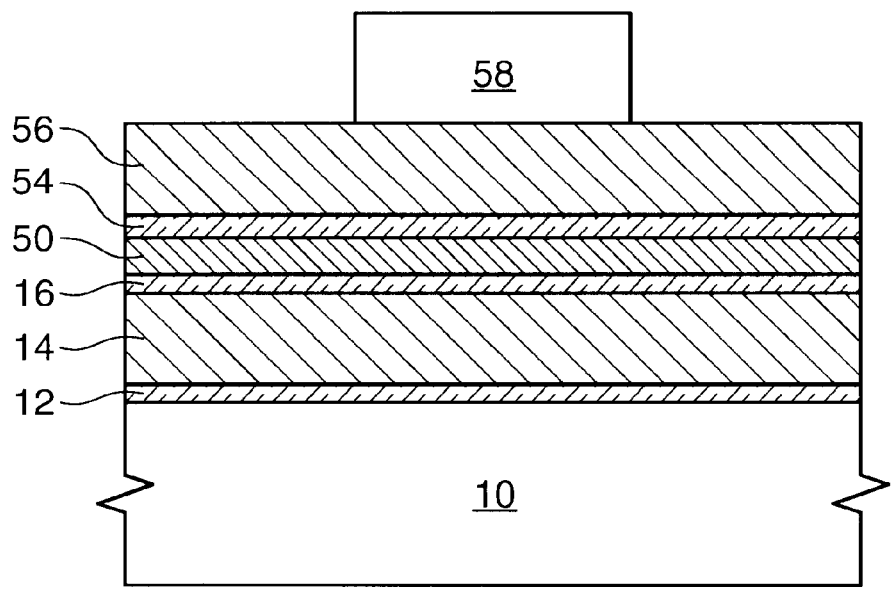

After the poly or amorphous silicon layer is formed over the nitride layer the poly is oxidized, for example in a diffusion furnace to form the top oxide layer 54 of the ONO stack as depicted in FIG. 5. For a dry oxidation, the structure is elevated to a temperature of between about 750° C. and about 900° C., for example 900° C. in the presence of $O_2$ gas having a flow rate of between about 2.0 SLM and about 10.5 SLM, for example about 9 SLM for between about 5 minutes and 15 minutes. For a wet oxidation, the layer is exposed to $O_2$ and $H_2$ gas. Beginning with a poly layer having a thickness of between about 5 Å and about 25 Å thick results in a top oxide layer from about 10 Å to about 60 Å thick. Preferably, the thin poly layer 52 overlying the nitride 50 in FIG. 4 is completely oxidized to form layer 54 of FIG. 5 so that subsequent processing steps are not adversely affected by any unoxidized poly. Wafer processing then continues according to means known in the art, for example to form the control gate poly layer 56 over the ONO stack 16, 52, 54, masking 58 then etching layers 12–56 of FIG. 5 to pattern the floating gate, the control gate, and the ONO stack.

An advantage of the silicon-rich nitride layer portion is that the growth of the second oxide layer over the nitride layer is self-limiting. As the silicon concentration decreases deeper into the nitride layer the oxidation rate decreases and oxide formation slows. Thus the thickness of the second oxide layer overlying the nitride may be more controllable than a deposited oxide layer or an oxide layer which is grown on a conventional nitride layer. Further, forming the ONO layer at decreased temperatures over conventional processes improves the charge trapping properties of the tunnel oxide. Similarly, forming a poly layer over a nitride layer then oxidizing the poly has similar advantages over conventional processes as the poly is more readily oxidized at lower temperatures than is nitride. Further, oxidizing a poly layer overlying the nitride is also somewhat limiting as the poly oxidizes at a much faster rate than the nitride.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An in-process floating gate memory device comprising:

a floating gate layer;

a silicon dioxide layer overlying said floating gate layer;

a siliconized nitride layer overlying and contacting said silicon dioxide layer, said siliconized nitride layer having a lower portion which is not siliconized and an upper portion which is siliconized; and a concentration of silicon atoms in said upper portion, wherein said silicon atom concentration in said upper portion of said nitride layer increases throughout said siliconized upper portion of said nitride layer.

2. The in-process device of claim 1 further comprising:

said lower portion of said siliconized nitride layer having a formula of $Si_3N_4$; and said upper portion of said siliconized nitride layer having a formula of $Si_xN_4$, where x>3.

3. The in-process device of claim 2 further comprising said siliconized nitride layer having a thickness of about 100 Å.

* * * * *